(12) United States Patent
Cheng et al.

(10) Patent No.: US 6,657,285 B1
(45) Date of Patent: Dec. 2, 2003

(54) SEMICONDUCTOR ANTI-INTERFERENCE BAND FOR INTEGRATED CIRCUIT

(75) Inventors: Jean-Jen Cheng, Taipei (TW); Pei-Sung Chuang, Taipei Hsien (TW); Kuan-Chia Huang, Lu-Chou (TW)

(73) Assignee: Alcor Micro, Corp., Taipei (TW)

( * ) Notice: Subject to any disclaimer, the term of this patent is extended or adjusted under 35 U.S.C. 154(b) by 0 days.

(21) Appl. No.: 10/189,495

(22) Filed: Jul. 8, 2002

(51) Int. Cl.[7] ............................................. H01L 23/552
(52) U.S. Cl. ...................................................... 257/659
(58) Field of Search ......................................... 257/659

(56) References Cited

U.S. PATENT DOCUMENTS

| | | | | |
|---|---|---|---|---|
| 4,514,749 A | * | 4/1985 | Shoji ........................... | 257/659 |
| 4,628,343 A | * | 12/1986 | Komatsu ....................... | 257/659 |
| 4,958,222 A | * | 9/1990 | Takakura et al. ............... | 257/659 |
| 5,050,238 A | * | 9/1991 | Tomizuka et al. .............. | 257/659 |
| 5,155,570 A | * | 10/1992 | Tomizuka et al. .............. | 257/501 |
| 5,160,997 A | * | 11/1992 | Sandoh et al. ................ | 257/659 |
| 5,475,255 A | * | 12/1995 | Joardar et al. ................ | 257/659 |

* cited by examiner

Primary Examiner—Gene M. Munson

(57) ABSTRACT

A semiconductor anti-interference band distributed on peripheries of partial of regional circuits in an integrated circuit is assembled by an unequal number of PNP structures; two metal bands are disposed on the surface layer of the integrated circuit, wherein one band connects with GND and the other connects with Vcc; to add positive voltage at Vcc increases the charge at P+ tip thereby generating a parasitic capacitance on a poly layer between two P+ tips and limiting a noisy signal within the distributed area; furthermore, the P+ tip and an N well connect to produce a positive voltage zone in a large area to forcefully prevent a noisy signal current from passing through and make it discharge at a ground end with lower voltage so as to achieve the electromagnetic anti-interference function of the integrated circuit.

6 Claims, 4 Drawing Sheets

SEMICONDUCTOR ANTI-INTERFERENCE BAND FOR INTEGRATED CIRCUIT

BACKGROUND OF THE INVENTION

1) Field of the Invention

The present invention relates to a semiconductor anti-interference band, more particularly to an anti-interference band capable of not only using two P+ tips to increase voltage inside an integrated circuit thereby generating a tremendous value of a parasitic capacitance on a poly layer between the two P+ tips so as to not only eliminate the discharge of a noisy signal with high frequency, but also map as well as protect the circuit area.

2) Description of the Prior Art

Accordingly, semiconductors have been extensively applied to various electronic and electrical products as the driving elements for controlling the circuits, calculating the digital values and storage. More especially, the miniaturization of the volume has been adopted greatly in all kinds of circuits to reduce the volume design of the structure and the energy loss in the circuits; the structure of an integrated circuit is assembled by mapping a plurality of electronic circuits according to the different application sites and functions; for example, some of the integrated circuit products require accurate anti-interference functions for wireless telecommunication.

However, the interior structure of a conventional integrated circuit lacks an efficient strategy and design. The noisy signal current generated from the more intensive wire lines inside the integrated circuit usually flows along the wire lines thereby seriously influencing the electric stability and quality thereof. However, to use an external metal electromagnetic cover to shield and protect the integrated circuit from interference inconveniences the application, merely eliminates the; factors of electromagnetic interference existing outside the circuit but fails to efficiently get rid of those factors and problems inside the integrated circuit. Therefore, that issue has to be solved immediately.

SUMMARY OF THE INVENTION

Therefore, the primary objective of the present invention is to provide a semiconductor anti-interference band comprises a PNP structure assembled and enclosed the outer periphery of a partial circuit to be implemented for anti-interference protection inside an integrated circuit so as to provide an electromagnetic function inside the integrated circuit.

Another objective of the present invention is to provide a semiconductor anti-interference band, wherein the semiconductor PNP structure has an externally added positive voltage between a P+ tip and a N− tip to enable a poly layer between two P+ tips to generate an extremely high parasitic capacitance value so as to enhance an electromagnetic anti-interference effect with high frequency.

Yet Another objective of the present invention is to provide a semiconductor anti-interference band mapped and arranged according to the inner circuit of the integrated circuit; furthermore, the length of the anti-interference band is determined according to the area requested by the inner circuit for anti-interference so as to enhance the anti-interference effect of a unit area inside the integrated circuit.

In order to achieve the abovementioned objectives, the present invention is an anti-interference band structure enclosing around the peripheries of partial circuit regions inside the integrated circuit. The anti-interference band comprises a metal band connecting with Vcc source and drain ends to be referred as a Vcc metal band and a GND metal band (at the drain end). Through a contact hole, the Vcc metal band and the GND metal band connect with a first metal layer (Metal 1) on the next layer; through another contact hole, the first metal layer connected at the GND end joins the poly layer; the first metal layer connected at the Vcc end joins a P+ key of positive electric value; both of the poly layer and the P+ key of positive electric value are situated on N well; the lowest layer is a P− silicon bottom layer. The parasitic capacitance generated from the source and the drain provides the electromagnetic anti-interference function from the partial circuit enclosed by the anti-interference band inside the integrated circuit.

To enable a further understanding of the structure and the practical operation of the present invention, the brief description of the drawings below is followed by the detailed description of the preferred embodiment.

DETAILED DESCRIPTION OF THE PREFERRED EMBODIMENTS

Figure 1:
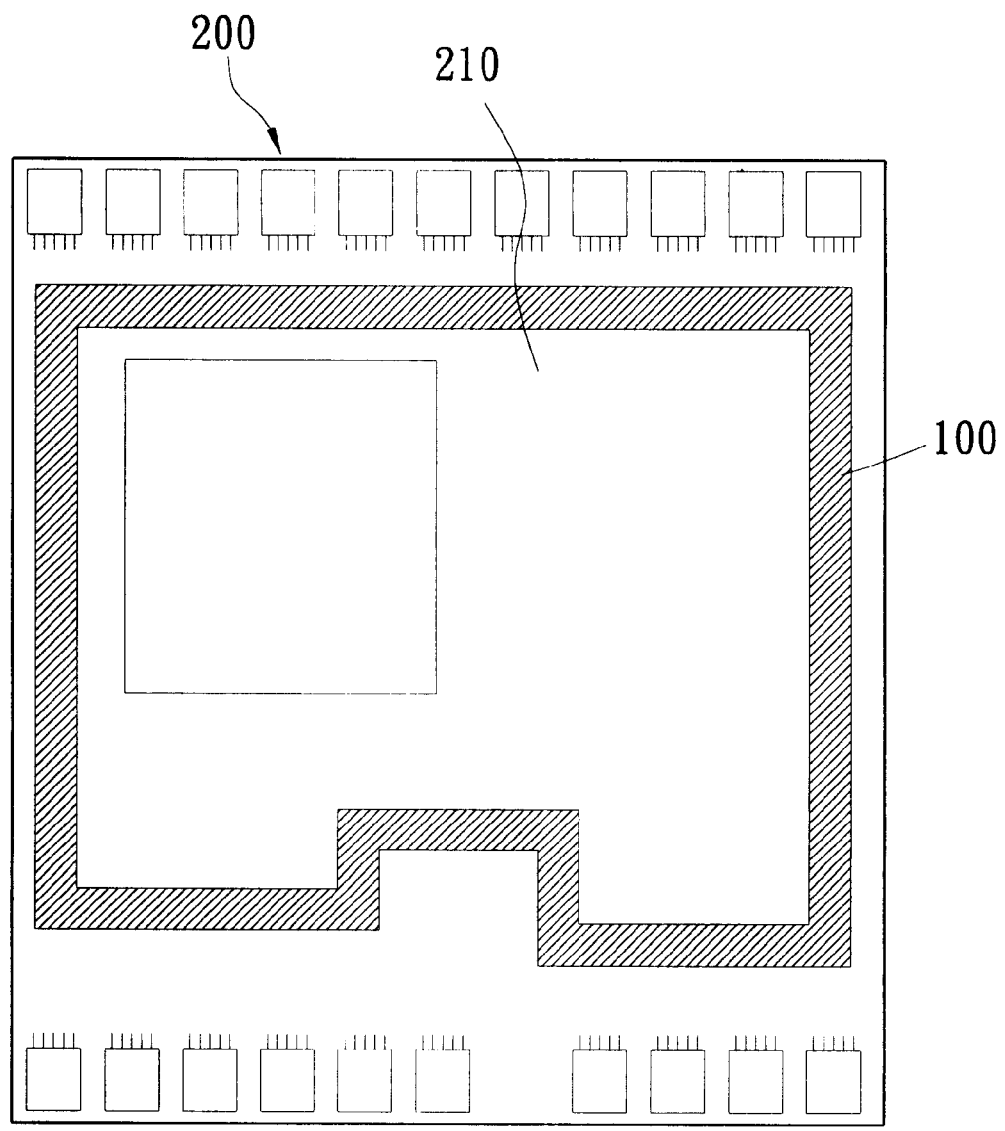
FIG. 1 is a drawing showing the state of the present invention of an anti-interference band inside an integrated circuit.

Referring to FIG. 1, as indicated, a semiconductor anti-interference band (100) of the present invention is mapped along with the circuit distribution inside an integrated circuit (200) to enclose on the peripheries of a partial circuit (210) therein; the partial circuit (210) is the targeted wire line to be protected and anti-interfered.

Figure 2:
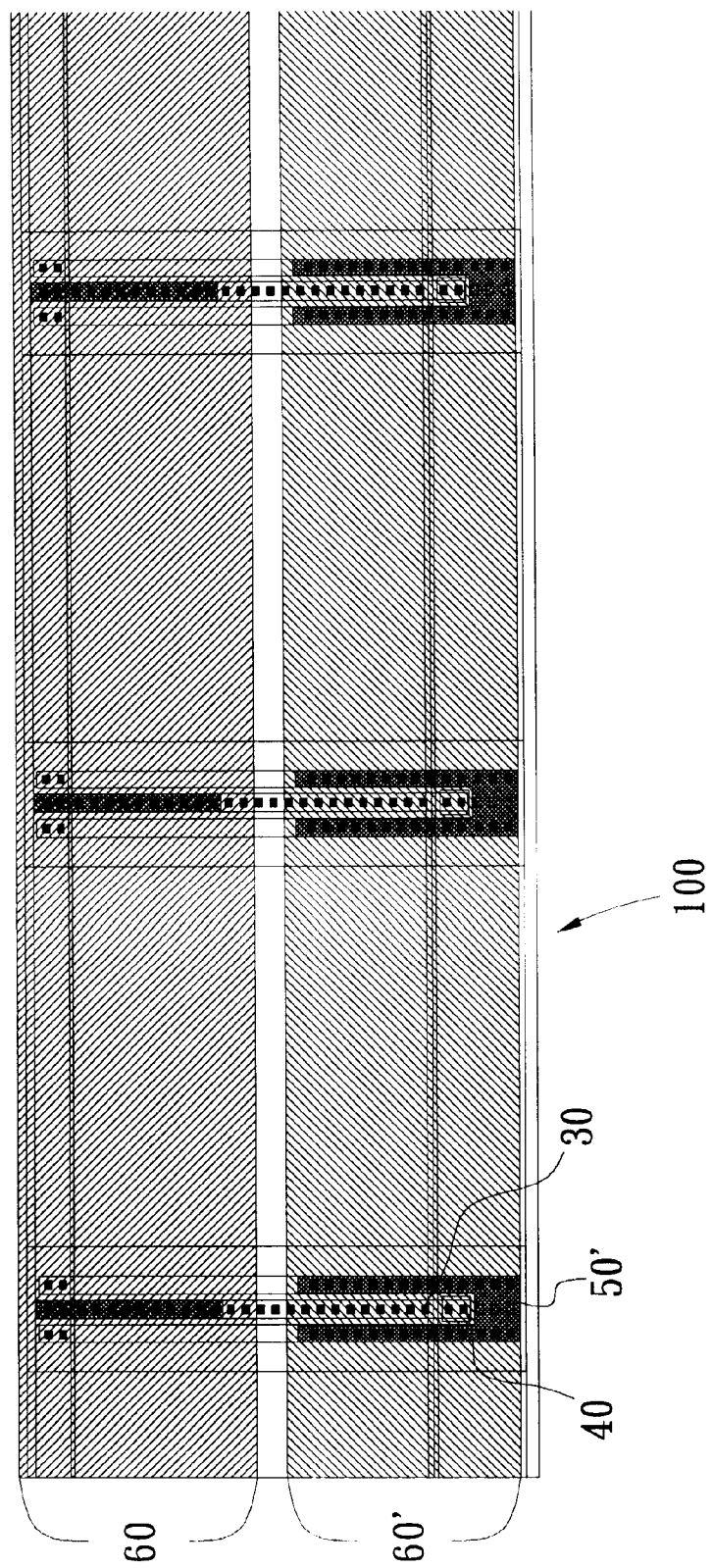
FIG. 2 is a bird's-eye view and enlarged drawing of the anti-interference band of the present invention.
Figures 3, 3A:
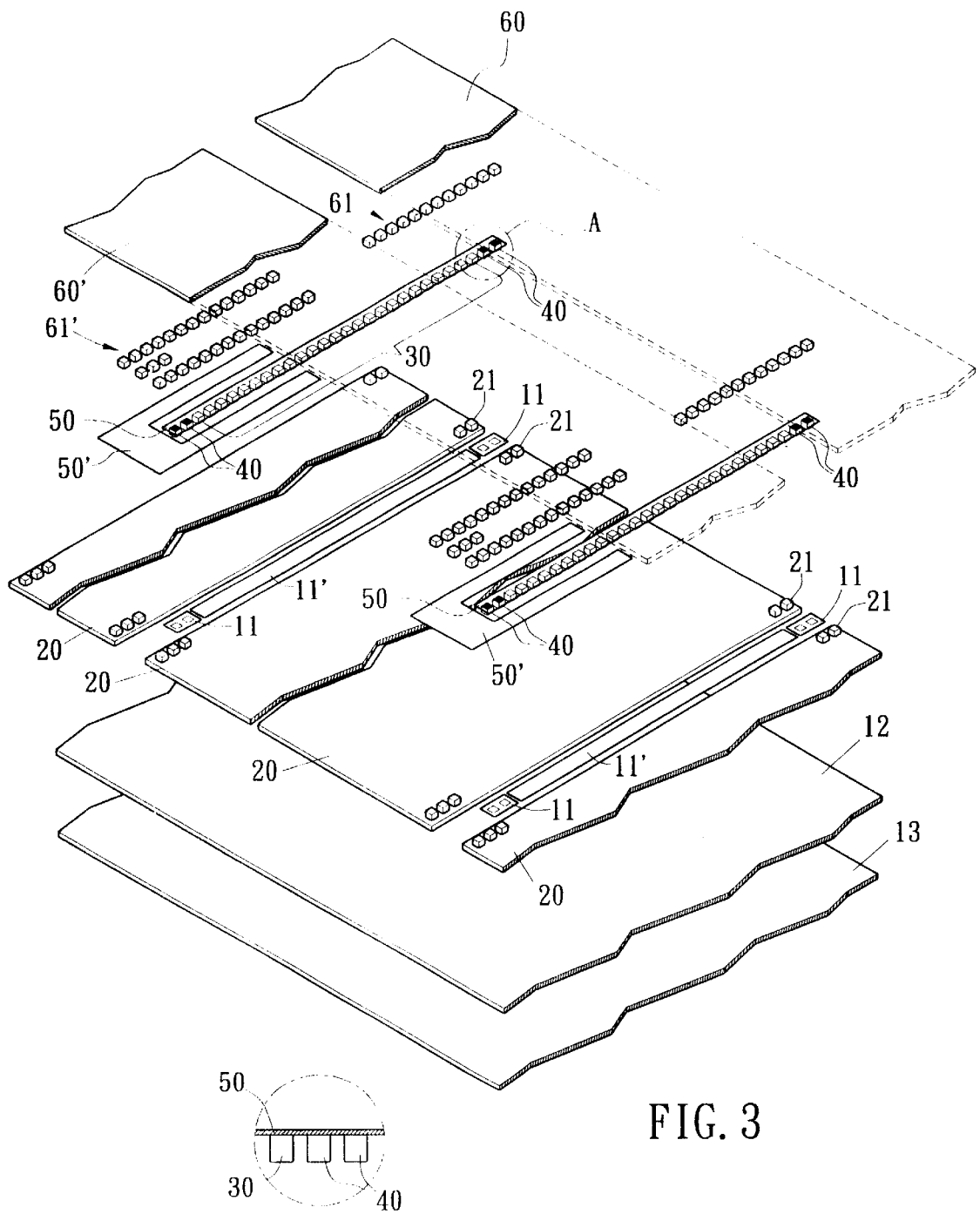
FIG. 3 is a pictorial, exploded and structural drawing of the anti-interference band of the present invention.
FIG. 3A is a partial enlargement drawing of FIG. 3.

As viewed from the upper aspect of the anti-interference band (100), FIGS. 2, 3 and 3A show the relative positions among a Vcc metal band (60) connecting with a positive voltage, a metal band (60') connecting with GND, contact holes (30, 40) and a first metal layer; wherein, the present invention of a semiconductor anti-interference band (100) comprises a plurality of PNP structures (10), a plurality of poly layers (20), P+ layers (11') and N-layers (11), a plurality of first metal layers (50, 50'), Vcc metal band (60) and GND metal band (60') and a plurality of contact holes; wherein, a N Well layer (12) forms on a P− bottom layer (13); furthermore, a positive value P+ layer (11'), a negative value N− layer (11) and a poly layer (20) form on the N Well layer (12). The contact hole (40) designed in the area of the negative value N− layer (11) connects with the first metal layer Metal 1 (50); the contact hole (30) designed in the area of the positive value P+ layer (11') connects with the first metal layer (50); a contact hole (61) connects with the Vcc metal band (Metal 2, 60) to make the Vcc added by positive voltage a source and a drain.

A contact hole (21) designed in the area of the poly layer (20) connects with the first metal layer (50'); it further connects with GND metal band (60') through a contact hole (61'); the GND metal band (60') works as a gate to contact the ground.

Figure 4:
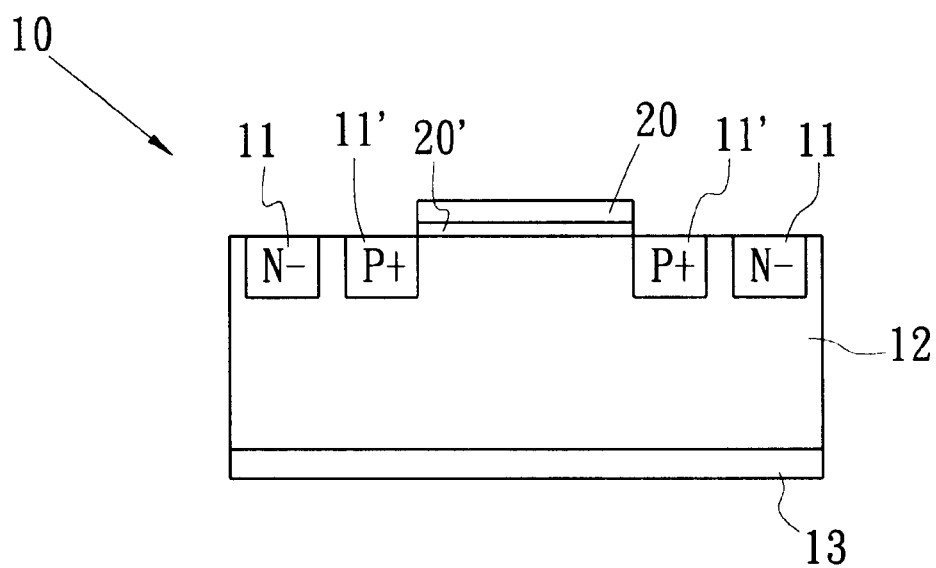
FIG. 4 is a partial enlargement and cross-sectional drawing of a PNP structure of the present invention.

According to the abovementioned and referring to FIG. 4, the Vcc metal band (60) and the GND metal band (60') are separately connected with a positive electrode terminal and a negative electrode terminal (not shown) of a power source of the integrated circuit (200) to respectively provide a work power needed by the PNP structure (10), the positive value P+ layer (11') and the negative value layer (11). The bottom portion of the Vcc metal band (60) joins with a plurality of contact holes (61) thereby directly connecting onto the first metal layer (50) to guide the positive electrode power into the first metal layer (50).

The bottom portion of the GND metal band (60') joins with a plurality of contact holes (61') thereby connecting onto another first metal layer (50') to guide the negative electrode power into the first metal layer (50'). The abovementioned guiding processes enable the PNP structure (10), the positive value P+ layer (11') and the negative N− layer (11) to work; in other words, both of the source (S) and the drain (D) represented by the positive value P+ layer (11') and the negative value N− layer (11) obtain the supply of the positive electrode power. The negative electrode power guides into and affixes onto the poly layer (20) to form a parasitic capacitance between the source (S) and the drain (D) thereby generating the function of electromagnetic anti-interference. In the exemplary embodiment of the present invention, the value of the parasitic capacitance is about 28Pf ($28\times10^{-12}$) with a unit area of 70 $\mu$m×90 $\mu$m and the quantity of anti-interference current about 92 uA/usec. However, the parasitic capacitance, the anti-interference unit area and the quantity of the anti-interference current are variable and adjustable by properly arranging the volumes and areas of the PNP structure (10), the poly layer (20), the positive value P+ layer (11'), the negative value N− layer (11), the first metal layers (50, 50') and the second metal band (60, 60').

The method and the structure of the assembly among the semiconductor anti-interference band (100) of the present invention, the positive value P+ layer (11') and the negative value N− layer (11) as well as the method of connecting assembly among the first metal layers (50, 50'), the Vcc metal band (60) and the GND metal band (60') should not be limited to the exemplary structures indicated in the above Figures. Any arrangement or connection method with equal efficiency should not depart from the scope of the present invention.

Based on the detailed description of the structure, action and function of the present invention of the semiconductor anti-interference band (100), the advantages, practical effects and industrial utilization value thereof are summed up as follows:

The present invention is mapped inside an integrated circuit to provide an anti-interference function in a partial circuit; more especially, its convenient connection inside a complementary metal oxide semiconductor (CMOS) to generate an electromagnetic anti-interference function facilitates the industrial utilization.

To arrange and adjust the area and volume of the structure of the semiconductor anti-interference band simply and conveniently adjusts the parasitic capacitance for generating the anti-interference function, the unit area of the anti-interference and the quantity of the anti-interference current.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A semiconductor anti-interference enclosing on the periphery of a partial circuit inside an integrated circuit comprising:

a complementary metal oxide semiconductor (CMOS) structure connecting with two metal bands, one joining a Vcc positive voltage and the other joining GND, called a Vcc metal band and a GND metal band;

through a contact hole, the Vcc metal band connects with the first metal band; the GND metal band also connects with the first metal band through a contact hole;

the first metal band joined with Vcc further connects with a next P+ layer and a N− layer to form a source and a drain; the first metal band joined with GND further connects with a next poly layer through a contact hole to form a gate;

an N Well is the bottom layer of the abovementioned structure and the lowest bottom layer thereof is a P− silicon bottom layer;

wherein, through the PNP structure, the main feature is to use a parasitic capacitance formed between the source and the drain of the poly layer, the positive value P+ layer and the negative N− layer to generate an electromagnetic anti-interference function;

wherein, the connection of the N Well and the PNP structure forcefully prevent a noisy signal current generated from the inner circuit from passing a higher voltage layer and make it discharge through a GND end with lower voltage to achieve the anti-interference function.

2. A semiconductor anti-interference band according to claim 1, wherein the semiconductor anti-interference band comprises an unequal number of PNP structures enclosing a partial circuit region inside the integrated circuit.

3. A semiconductor anti-interference band according to claim 1, wherein voltage is added to a source end and a drain end of the PNP structure to make the poly layer generate a tremendous parasitic capacitance to preferably eliminate a noisy signal with high frequency.

4. A semiconductor anti-interference band according to claim 1, wherein the Vcc metal band and the GND metal band are gathered and connected by the circuit to connect to PAD for facilitating the handling of an external noisy signal.

5. A semiconductor anti-interference band according to claim 1, wherein the anti-interference band connects onto the N Well which is situated between the silicon bottom layer and the poly layer to generate a positive voltage zone through the supply of a positive voltage thereby forcefully preventing the noisy signal current from passing and making it discharge through the GND end with a lower voltage.

6. A semiconductor anti-interference band according to claim 1, wherein two metal bands enclosing on peripheries of partial circuits inside the integrated circuit, one GND metal band situated on a surface contacting a partial circuit region inside the integrated circuit and the other Vcc metal band situated on a surface not contacting a partial circuit region inside the integrated circuit.

* * * * *